(12) United States Patent
Breiling et al.

(10) Patent No.: US 9,758,868 B1
(45) Date of Patent: Sep. 12, 2017

(54) PLASMA SUPPRESSION BEHIND A SHOWERHEAD THROUGH THE USE OF INCREASED PRESSURE

(71) Applicant: Lam Research Corporation, Fremont, CA (US)

(72) Inventors: Patrick Girard Breiling, Portland, OR (US); Ramesh Chandrasekharan, Portland, OR (US); Edmund Minshall, Sherwood, OR (US); Colin Smith, Half Moon Bay, CA (US); Andrew Duvall, Tualatin, OR (US); Karl Leeser, West Linn, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/066,550

(22) Filed: Mar. 10, 2016

(51) Int. Cl.
*C23C 16/455* (2006.01)
*C23C 16/50* (2006.01)

(52) U.S. Cl.
CPC ............ *C23C 16/455* (2013.01); *C23C 16/50* (2013.01)

(58) Field of Classification Search
None
See application file for complete search history.

(56) References Cited

U.S. PATENT DOCUMENTS

| | | | |
|---|---|---|---|
| 2,124,940 A | 7/1938 | Zink | |
| 2,679,821 A | 6/1954 | Kuebler | |
| 3,621,812 A | 11/1971 | Hissong, Jr. et al. | |
| 4,961,399 A | 10/1990 | Frijlink | |
| 4,989,541 A | 2/1991 | Mikoshiba et al. | |
| 5,399,254 A | 3/1995 | Geisler et al. | |
| 5,453,124 A | 9/1995 | Moslehi et al. | |
| 5,532,190 A | 7/1996 | Goodyear et al. | |
| 5,580,387 A | 12/1996 | Chen | |

(Continued)

FOREIGN PATENT DOCUMENTS

| | | |
|---|---|---|
| CN | 201343570 Y | 11/2009 |
| CN | 101657565 A | 2/2010 |
| CN | 102246274 A | 11/2011 |

OTHER PUBLICATIONS

First Office Action issued Oct. 31, 2016 corresponding to Chinese Patent Application No. 201310256636.8, 6 pages.

(Continued)

*Primary Examiner* — Joseph Miller, Jr.

(57) ABSTRACT

A substrate processing system includes a showerhead including a stem portion and a head portion. The stem portion is in fluid communication with a process gas source, and the head portion is arranged to provide process gases from the process gas source to a reaction volume of a processing chamber below the showerhead to generate plasma in the reaction volume. A suppressor is arranged above the head portion of the showerhead, extends from the stem portion toward sidewalls of the processing chamber, and is sealed against the sidewalls of the processing chamber or sealed against an enclosure surrounding the suppressor. The suppressor, the sidewalls, and a top surface of the processing chamber, the suppressor and the enclosure, or the suppressor, the enclosure, and the top surface define a partitioned volume of the processing chamber above the showerhead. The partitioned volume is in fluid communication with a purge gas source.

13 Claims, 8 Drawing Sheets

(56) References Cited

U.S. PATENT DOCUMENTS

| | | | |
|---|---|---|---|
| 5,614,026 A | 3/1997 | Williams | |
| 5,954,881 A | 9/1999 | Burk, Jr. et al. | |
| 6,059,885 A | 5/2000 | Ohashi et al. | |
| 6,132,512 A | 10/2000 | Horie et al. | |
| 6,149,727 A | 11/2000 | Yoshioka et al. | |
| 6,183,563 B1 | 2/2001 | Choi et al. | |
| 6,285,010 B1 | 9/2001 | Fujikawa et al. | |
| 6,289,842 B1 | 9/2001 | Tompa | |
| 6,302,965 B1 | 10/2001 | Umotoy et al. | |
| 6,387,182 B1 | 5/2002 | Horie et al. | |
| 6,444,039 B1 | 9/2002 | Nguyen | |
| 6,478,872 B1 | 11/2002 | Chae et al. | |
| 6,495,233 B1 | 12/2002 | Shmurun et al. | |
| 6,499,425 B1 | 12/2002 | Sandhu et al. | |
| 6,830,624 B2 | 12/2004 | Janakiraman et al. | |
| 6,849,241 B2 | 2/2005 | Dauelsberg et al. | |
| 6,899,764 B2 | 5/2005 | Frijlink | |
| 6,998,014 B2 | 2/2006 | Chen et al. | |
| 7,017,514 B1 | 3/2006 | Shepherd, Jr. et al. | |
| 7,572,337 B2 | 8/2009 | Rocha-Alvarez et al. | |
| 7,622,005 B2 | 11/2009 | Balasubramanian et al. | |
| 7,758,698 B2 | 7/2010 | Bang et al. | |
| 8,092,598 B2 | 1/2012 | Baek et al. | |
| 8,100,081 B1 | 1/2012 | Henri et al. | |
| 8,152,924 B2 | 4/2012 | Dauelsberg et al. | |
| 8,197,636 B2 | 6/2012 | Shah et al. | |
| 8,715,455 B2 | 5/2014 | Brcka | |
| 8,882,913 B2 | 11/2014 | Byun et al. | |
| 8,968,512 B2 | 3/2015 | Nishimoto | |
| 9,388,494 B2 | 7/2016 | Xia et al. | |
| 9,399,228 B2 | 7/2016 | Breiling et al. | |
| 2001/0008205 A1* | 7/2001 | Wilke | C23C 14/0042 204/192.18 |
| 2002/0039625 A1 | 4/2002 | Powell et al. | |
| 2003/0019580 A1* | 1/2003 | Strang | C23C 16/45565 156/345.33 |
| 2003/0054099 A1 | 3/2003 | Jurgensen et al. | |
| 2003/0070620 A1 | 4/2003 | Cooperberg et al. | |
| 2003/0075273 A1 | 4/2003 | Kilpela et al. | |
| 2003/0077388 A1 | 4/2003 | Byun | |
| 2004/0011286 A1 | 1/2004 | Kwon | |
| 2004/0168769 A1 | 9/2004 | Matsuoka et al. | |
| 2004/0216844 A1 | 11/2004 | Janakiraman et al. | |
| 2005/0263072 A1 | 12/2005 | Balasubramanian et al. | |
| 2005/0263248 A1 | 12/2005 | Rocha-Alvarez et al. | |
| 2005/0263484 A1 | 12/2005 | Park et al. | |
| 2006/0090705 A1 | 5/2006 | Kim | |
| 2006/0130756 A1 | 6/2006 | Liang et al. | |
| 2006/0196420 A1 | 9/2006 | Ushakov et al. | |
| 2006/0196603 A1 | 9/2006 | Lei et al. | |
| 2006/0263522 A1 | 11/2006 | Byun | |
| 2007/0293043 A1 | 12/2007 | Singh et al. | |
| 2008/0121177 A1 | 5/2008 | Bang et al. | |
| 2008/0121179 A1 | 5/2008 | Park et al. | |
| 2008/0124944 A1 | 5/2008 | Park et al. | |
| 2008/0185104 A1 | 8/2008 | Brcka | |
| 2008/0185284 A1 | 8/2008 | Chen et al. | |
| 2008/0188087 A1 | 8/2008 | Chen et al. | |
| 2008/0241384 A1 | 10/2008 | Jeong et al. | |
| 2008/0308040 A1 | 12/2008 | Dauelsberg et al. | |
| 2009/0056629 A1 | 3/2009 | Katz et al. | |
| 2009/0095219 A1 | 4/2009 | Meinhold et al. | |
| 2009/0095220 A1 | 4/2009 | Meinhold et al. | |
| 2009/0159424 A1 | 6/2009 | Liu et al. | |
| 2010/0003406 A1 | 1/2010 | Lam et al. | |
| 2010/0048028 A1 | 2/2010 | Rasheed et al. | |
| 2010/0055342 A1 | 3/2010 | Chiang et al. | |
| 2010/0288728 A1 | 11/2010 | Han et al. | |
| 2011/0195202 A1* | 8/2011 | Dahm | C23C 16/4405 427/569 |
| 2011/0198417 A1 | 8/2011 | Detmar et al. | |
| 2011/0253044 A1 | 10/2011 | Tam et al. | |
| 2012/0161405 A1 | 6/2012 | Mohn et al. | |
| 2013/0092086 A1 | 4/2013 | Keil et al. | |
| 2013/0341433 A1 | 12/2013 | Roy et al. | |
| 2013/0344245 A1* | 12/2013 | Xia | C23C 16/4401 427/255.7 |
| 2014/0072726 A1 | 3/2014 | Kim | |
| 2014/0217193 A1 | 8/2014 | Breiling et al. | |
| 2014/0235069 A1 | 8/2014 | Breiling et al. | |
| 2015/0167168 A1 | 6/2015 | Keshavamurthy et al. | |

OTHER PUBLICATIONS

Search Report and Written Opinion corresponding to Singapore Application No. 201304839-2 dated Nov. 4, 2014, 12 pages.

Terry Day. "The Coanda Effect and Lift. Copyright 2008." pp. 1-017. Source location: http://www.vortexu dynamics.com.au/lift.html. Available: http://www.newfluidtechnology.com.au/wpcontent/uploads/THE_COANDA_EFFECT_AND_LIFT.pdf. Accessed: Dec. 12, 2014.

U.S. Appl. No. 13/842,054, filed Mar. 15, 2013, entitled "Radical Source Design for Remote Plasma Atomic Layer Deposition."

U.S. Appl. No. 13/934,597, filed Jul. 3, 2013, entitled "Multi-Plenum, Dual-Temperature Showerhead."

* cited by examiner

PLASMA SUPPRESSION BEHIND A SHOWERHEAD THROUGH THE USE OF INCREASED PRESSURE

CROSS-REFERENCE TO RELATED APPLICATIONS

Field

The present disclosure relates to substrate processing systems and more specifically to purging and plasma suppression in a substrate processing system.

Background

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems such as plasma-enhanced atomic layer deposition (PEALD) and plasma-enhanced chemical vapor deposition (PECVD) may be used to deposit and etch films on substrates such as semiconductor wafers. Some PEALD and PECVD systems include chandelier-type showerheads that supply precursor gas to a processing chamber.

The showerheads typically include a stem portion that extends into the processing chamber and a head portion connected to the stem portion. A cavity is formed behind the head portion between the head portion and an upper surface of the processing chamber. Parasitic plasma in this volume may cause unwanted deposition to occur.

There are two approaches for addressing problems associated with the volume behind the showerhead. In one approach, the volume is purged to prevent process gases from getting behind the showerhead and causing unwanted deposition. However, purging behind the showerhead does not isolate the volume. The lack of volume isolation increases the required flow rates to purge the required volume. Purging also requires high purge gas flow and some purge gas flow directionality. The higher purge gas flow tends to adversely impact process conditions by mixing with process gases and/or shifting the plasma impedance, which may cause light up behind the showerhead.

In another approach, an apparatus is used to suppress the plasma in the volume to prevent unwanted deposition behind the showerhead. Plasma suppression creates a barrier over the showerhead and reduces parasitic plasma in unwanted areas of the tool.

SUMMARY

A substrate processing system includes a showerhead including a stem portion and a head portion. The stem portion is in fluid communication with a process gas source, and the head portion is arranged to provide process gases from the process gas source to a reaction volume of a processing chamber below the showerhead to generate plasma in the reaction volume. A suppressor is arranged above the head portion of the showerhead. The suppressor extends from the stem portion toward sidewalls of the processing chamber and is one of sealed against the sidewalls of the processing chamber and sealed against an enclosure surrounding the suppressor within the sidewalls of the processing chamber. The suppressor, the sidewalls, and a top surface of the processing chamber, the suppressor and the enclosure, or the suppressor, the enclosure, and the top surface define a partitioned volume of the processing chamber above the showerhead. The partitioned volume is in fluid communication with a purge gas source.

A substrate processing method includes providing a showerhead including a stem portion and a head portion, wherein the stem portion is in fluid communication with a process gas source, providing process gases from the process gas source to a reaction volume of a processing chamber below the showerhead to generate plasma in the reaction volume, arranging a suppressor above the head portion of the showerhead, wherein the suppressor extends from the stem portion toward sidewalls of the processing chamber, one of sealing the suppressor against the sidewalls of the processing chamber and sealing the suppressor against an enclosure surrounding the suppressor within the sidewalls of the processing chamber, and defining a partitioned volume of the processing chamber above the showerhead according to one of the suppressor, the sidewalls, and a top surface of the processing chamber, the suppressor and the enclosure, and the suppressor, the enclosure, and the top surface. The partitioned volume is in fluid communication with a purge gas source.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Various approaches for addressing problems associated with a volume behind a showerhead include, for example only, purging behind the showerhead and/or isolating the volume behind the showerhead from RF energy being generated in front of the showerhead (i.e., in a reaction volume). These approaches may limit the flow of deposition-related gases into the volume behind the showerhead.

Parasitic plasma suppression systems and methods according to the principles of the present disclosure generate increased pressure in the volume behind the showerhead relative to the reaction volume in front of the showerhead. The increased pressure suppresses RF energy in the volume behind the showerhead to limit the generation of unwanted or unintended plasma behind the showerhead (referred to herein as parasitic plasma).

For example, a suppressor assembly is provided above (i.e., behind) the showerhead to isolate or partition the volume behind the showerhead from the reaction volume. One or more purge gases are supplied to the partitioned volume to increase the pressure of the partitioned volume relative to the reaction volume. The purge gases are supplied to increase the pressure to a predetermined (e.g., calibrated) pressure, which may be determined according to Paschen curve behavior associated with the purge gases and/or gases supplied to the reaction volume (e.g., process gases).

The suppressor assembly includes a suppressor that may be at least partially formed from dielectric material. The suppressor includes one or more openings arranged to allow the purge gases to flow at a controlled, predetermined flow rate from the partitioned volume to the reaction volume through the suppressor. Various parameters (e.g., quantity, diameter, shape, position, etc.) of the openings are selected based on a desired pressure in the partitioned volume. In some examples, the openings may be positioned to reduce unwanted deposition of material on selected surfaces both within the partitioned volume and the reaction volume. The parameters may be further selected, to achieve the desired pressure, based on process variables. The process variables may include, but are not limited to, the flow rate, downstream pressure (i.e., pressure in the reaction volume), gas species (e.g., of the purge gases and/or the process gases), etc. In one example, parameters of the openings are selected to increase the pressure in the partitioned volume by greater than 5 Torr relative to the downstream pressure (i.e., relative to the pressure in the reaction volume. In some examples, the pressure in the partitioned volume is controlled to be between two and ten times greater than the pressure in the reaction volume. For example only, if the pressure in the reaction volume is 1-3 Torr, the pressure in the partitioned volume is controlled to be 10 Torr.

In some examples, the suppressor assembly includes an enclosure encircling the suppressor. The enclosure defines a symmetrical perimeter around and above the suppressor, and the enclosure and the suppressor together define the partitioned volume. In examples where the showerhead and/or the suppressor is matched to the processing chamber (e.g., a shape of the suppressor is matched to a shape of an inner surface of the processing chamber), the suppressor can be sealed, via an O-ring or other sealing member, against the inner surface of the processing chamber. Conversely, if the suppressor is not matched to the processing chamber (e.g., the shape of the suppressor is different than the shape of the inner surface of the processing chamber, the processing chamber is not symmetrical, a diameter or width of the processing chamber is significantly greater than that of the suppressor, sidewalls of the processing chamber are a relatively large distance from the showerhead, etc.), it may be difficult to seal the suppressor against the inner surface of the processing chamber. Accordingly, the enclosure may be arranged such that the suppressor is instead sealed against and/or coupled to an inner surface of the enclosure to define the partitioned volume behind the showerhead.

Although described herein with respect to a single station substrate processing tool, the principles of the present disclosure may also be implemented in a multi-station substrate processing tool. For example only, the principles of the present disclosure may be implemented in a multi-station substrate processing tool that performs parallel and/or sequential processing.

Figure 1:
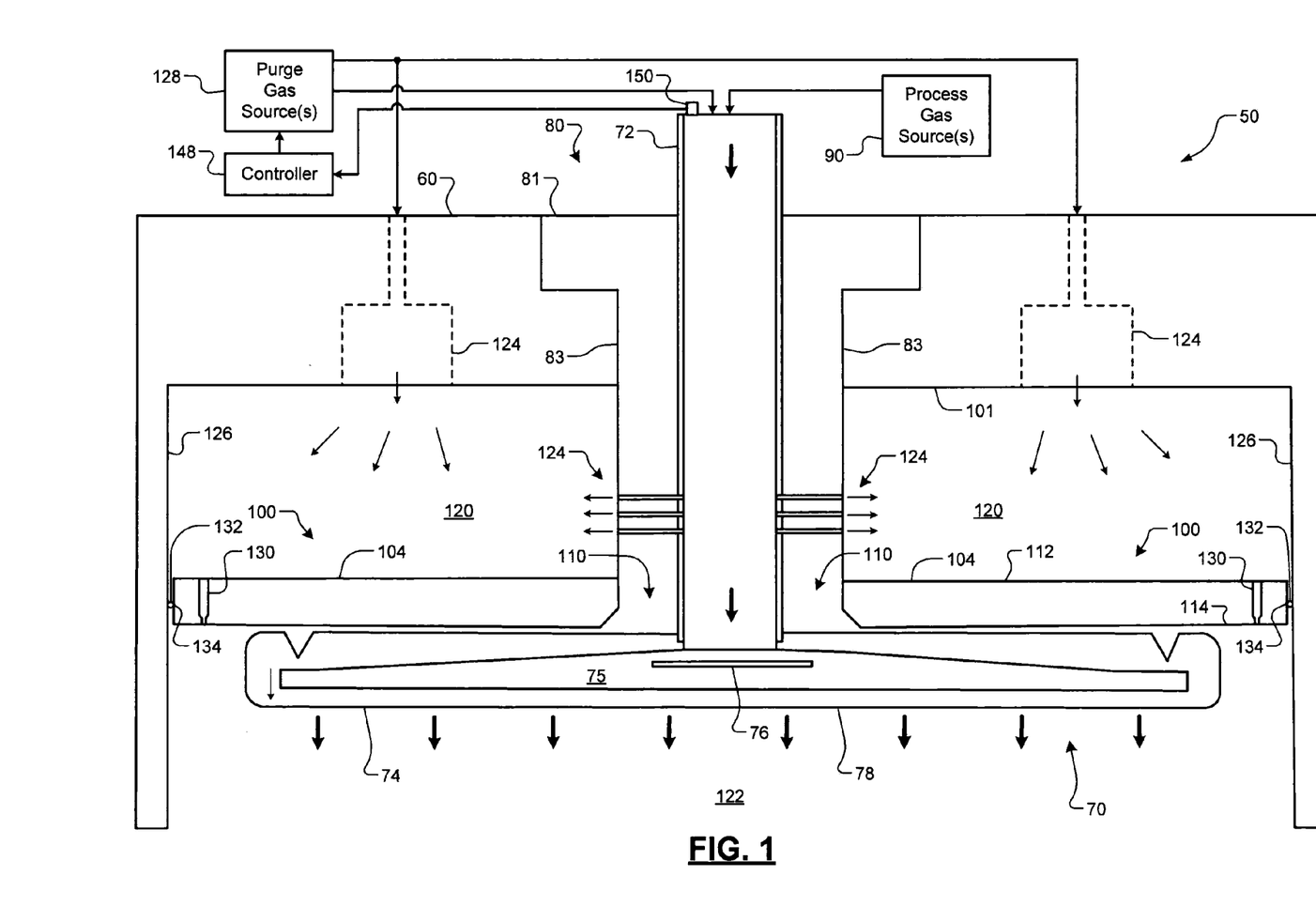
FIG. 1 is a cross-sectional view of a processing chamber with a showerhead and an example suppressor assembly according to the principles of the present disclosure.

Referring now to FIG. 1 and FIGS. 2A, 2B, 2C, and 2D, examples of a substrate processing system 50 including a processing chamber 60 with a showerhead 70 is shown. In FIG. 1, the showerhead 70 includes a stem portion 72 and a head portion 74. The head portion 74 defines an inner cavity 75 of the showerhead 70. Fluids (e.g., process gases) such as precursors or purge gas flow through the stem portion 72, onto a dispersion plate 76 and into the inner cavity 75. The fluids then pass through spaced holes 78 in a bottom surface of the head portion 74 and into the processing chamber 60. The stem portion 72 of the showerhead 70 is connected to a top wall of the processing chamber 60 by a collar 80. In some examples, the collar 80 has a generally "T"-shaped cross section and includes a head portion 81 and a stem portion 83. The system 50 includes a process gas source 90 in fluid communication with the stem portion 72 for flowing the process gases through the stem portion 72 and into the showerhead 70.

A suppressor assembly 100 including a suppressor 104, which may be formed from a dielectric material, is arranged between the head portion 74 of the showerhead 70 and a top surface or plate 101 of the processing chamber. The suppressor 104 includes a central opening or bore 110, a top surface 112 and a bottom surface 114. The suppressor 104 may be a plate or disc having an annular shape. As can be appreciated, the central opening or bore 110 of the suppressor 104 is not required in some examples. In other words, in some examples, the collar 80 may be integrated with the suppressor 104 and/or the central opening or bore 110 can be eliminated. In some examples, the suppressor 104 includes two or more separate plate sections (e.g., half-discs) that are joined together around the collar 80.

The suppressor 104 defines a partitioned volume 120 behind (i.e., above) the showerhead 70 to isolate the partitioned volume 120 from a reaction volume 122 in front of (i.e., below) the showerhead 70. One or more purge gas inlets 124 provided in the collar 80 (and/or, in some examples, as provided in the upper surface 101 of the processing chamber 60) may be used to supply purge gas into the partitioned volume 120 defined between the suppressor 104, the upper surface 101 of the processing chamber 60, and sidewalls 126 of the processing chamber 60. The system 50 includes one or more purge gas sources 128 in fluid communication with the partitioned volume 120 via the purge gas inlets 124 provided in the collar 80 and/or the upper surface 101 of the processing chamber 60. As shown, the partitioned volume 120 is not in fluid communication with (i.e., is isolated from) the process gas source 90. Accordingly, process gases supplied by the process gas source 90 are not provided to the partitioned volume 120 through the purge gas inlets 124. Accordingly, purge gases and process gases are independently and separately provided to the partitioned volume 120 and the reaction volume 122, respectively.

The suppressor includes one or more openings 130 arranged to allow the purge gases to flow, at a controlled, predetermined flow rate, from the partitioned volume 120 to the reaction volume 122 through the suppressor 104. For example, as shown in FIG. 1, the suppressor 104 extends to, and is sealed against (e.g., using sealing member 132), the side walls 126 of the processing chamber 60. For example only, the sealing member 132 may correspond to a polymer O-ring, seal, etc. In other words, in FIG. 1 the sidewalls 126 are symmetric and the suppressor 104 may have the same or a similar shape as the sidewalls 126, facilitating a secure seal between the suppressor 104 and the sidewalls 104. Accordingly, the purge gases flow from the partitioned volume 120 to the reaction volume 122 through the openings 130 in the suppressor 104 instead of flowing between the suppressor 104 and the sidewalls 126. In some examples, an outer surface of the suppressor 104 may include a notch or groove 124 configured to accept and retain the sealing member 132.

Figure 2A:
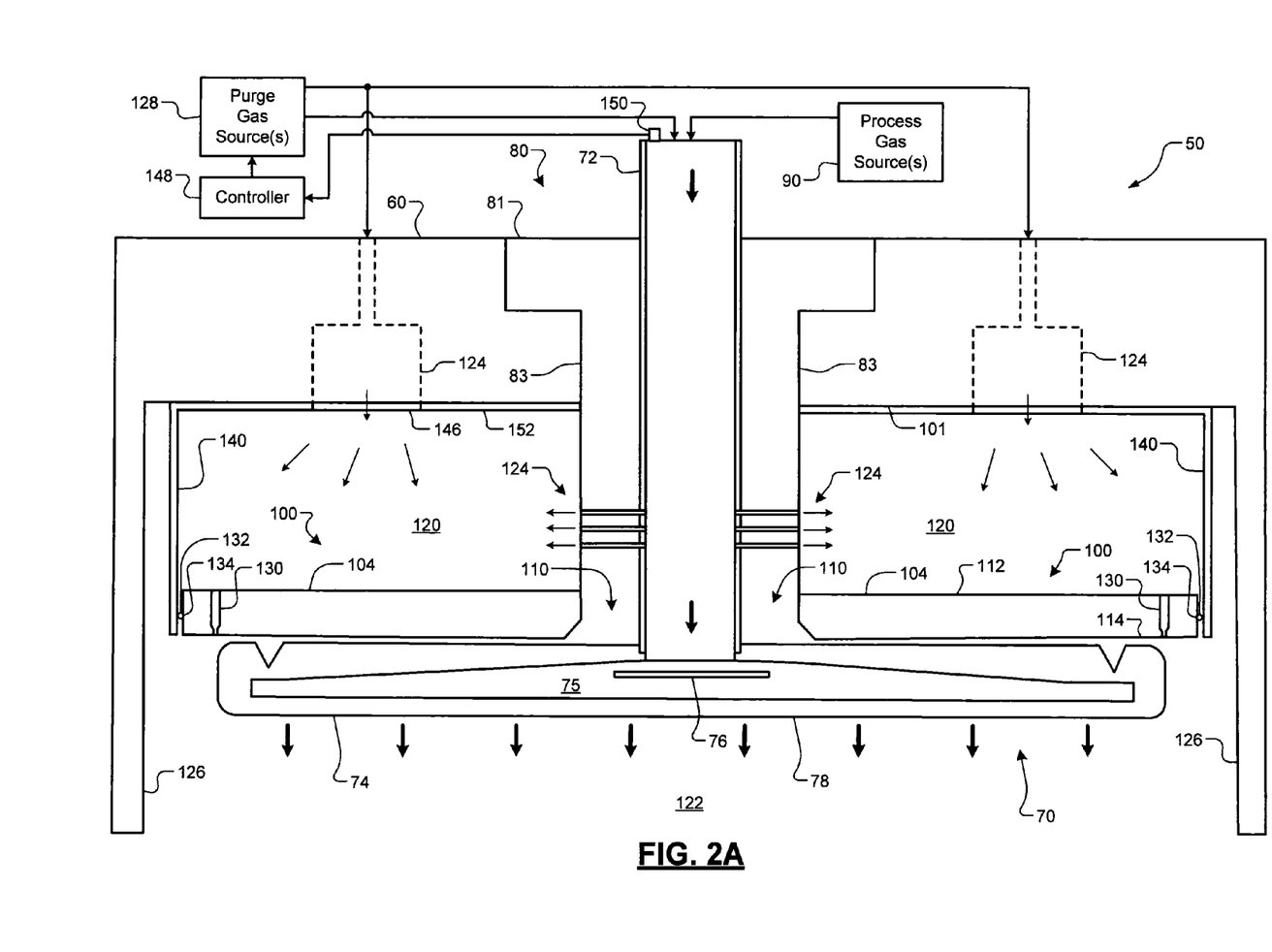
FIG. 2A is a cross-sectional view of a processing chamber with a showerhead and a first example suppressor assembly including an enclosure according to the principles of the present disclosure.

Conversely, as shown in FIG. 2A, the suppressor assembly 100 includes an enclosure 140 encircling the suppressor 104. The enclosure 140 defines a symmetrical perimeter around and above the suppressor 104, and the enclosure 140 and the suppressor 104 together define the partitioned volume 120. For example, if the suppressor 104 is a disc, the enclosure 140 may be cylindrical (although other shapes may be used). Accordingly, if the suppressor 104 is not the same shape as the sidewalls 126 of the processing chamber 60 and/or the suppressor 104 is significantly smaller (e.g., in diameter, width, etc.) than the sidewalls 126, the suppressor 104 is instead sealed against the enclosure 140. As shown in FIG. 2A, the suppressor 104 is sealed against the enclosure 140 using the sealing member 132. In other examples, such as in FIG. 2B, the enclosure 140 may be directly coupled to and/or integrally formed with the suppressor 104. For example only, the enclosure 140 may include two or more sections that are joined together to encircle the suppressor 104 and the stem portions 72 and 83. In another example as shown in FIG. 2C, the enclosure 140 is mounted on an outer edge of the suppressor 104. For example, the suppressor 104 may include a notch or groove 142 (e.g., an annular groove) configured to accept and retain the enclosure 140, with a sealing member 144 (e.g., an annular seal) arranged therebetween. In each of the examples, the enclosure 140 may include openings 146 aligned with purge gas inlets 124 arranged in the top surface 101.

Figure 3A:
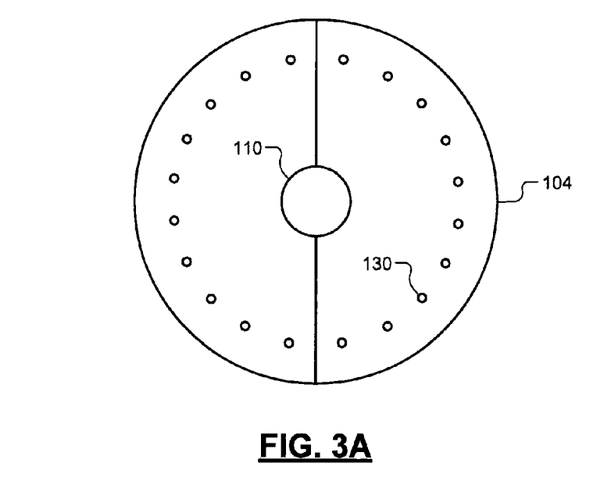
FIG. 3A is a plan view of an example suppressor according to the principles of the present disclosure.
Figure 3B:
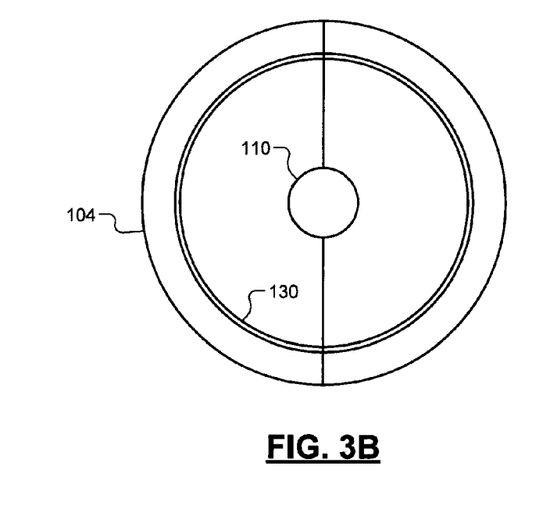
FIG. 3B is a plan view of another example suppressor according to the principles of the present disclosure.
Figure 4:
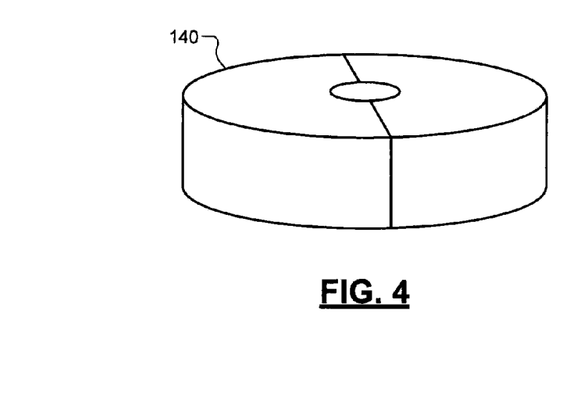
FIG. 4 is an isometric view of an example suppressor assembly including an enclosure according to the principles of the present disclosure.

FIGS. 3A and 3B show top-down views of examples of the suppressor 104. In FIG. 3A, the openings 130 correspond to a plurality of vias (e.g., round openings or holes) arranged near an outer perimeter of the suppressor 104. In FIG. 3B, the opening 130 corresponds to a continuous (e.g., annular or circular) slot formed in the suppressor. For example only, the suppressor 104 is shown as two halves that are configured to be joined together to form the central opening 110 and encircle the stem portions 72 and 83. FIG. 4 shows an isometric view of an example suppressor assembly 100 including the enclosure 140. For example only, the enclosure 140 is shown as two halves that are configured to be joined together and encircle the stem portions 72 and 83.

Various parameters (e.g., quantity, diameter, shape, position, etc.) of the openings 130 are selected based on a desired pressure in the partitioned volume 120. The parameters may be further selected, to achieve the desired pressure, based on process variables. The desired pressure may be based on Paschen curve behavior of the purge gas and/or the process gas. The process variables may include, but are not limited to, the desired flow rate, downstream pressure (i.e., pressure in the reaction volume 122), gas species (e.g., of the purge gases and/or the process gases), etc. In one example, parameters of the openings 120 are selected to increase the pressure in the partitioned volume 120 by greater than 5 Torr (e.g., 10 Torr) relative to the downstream pressure. In some examples, the pressure in the partitioned volume 120 is controlled to be between 2 and 10 times greater than the pressure in the reaction volume 122. In one example, the pressure in the partitioned volume 120 may be controlled according to an offset relative to the pressure in the reaction volume 122 (e.g., $P_{PV}=P_{RV}+\text{Offset}$, where $P_{PV}$ is the pressure in the partitioned volume 120, $P_{RV}$ is the pressure in the reaction volume 122, and Offset is a desired offset, such as 5 or 10 Torr). In another example, the pressure in the partitioned volume 120 may be controlled according to multiplier relative to the pressure in the reaction volume 122 (e.g., $P_{PV}=M*P_{RV}$, where $P_{PV}$ is the pressure in the partitioned volume 120, $P_{RV}$ is the pressure in the reaction volume 122, and M is a desired multiplier, such as 2, 5, 10, etc.).

The pressure in the partitioned volume 120 may be measured and the flow rate of the purge gases into the partitioned volume 120 is controlled accordingly. For example, a controller 148 may communicate with a pressure sensor (e.g., a manometer) 150 arranged to measure the pressure within the partitioned volume 120. The pressure sensor 150 is arranged to be in fluid communication with the partitioned volume 120 via the purge gas inlets 124. Although shown arranged external to the partitioned volume 120 and the purge gas inlets 124, the pressure sensor 150 may be arranged in any suitable location for measuring the pressure within the partitioned volume 120. The controller 148 may control the flow rate of the purge gases (e.g., by controlling a pump, valves, etc. associated with the purge gas source 128) according to the measured pressure to achieve a desired pressure within the partitioned volume 120.

Figure 2B:
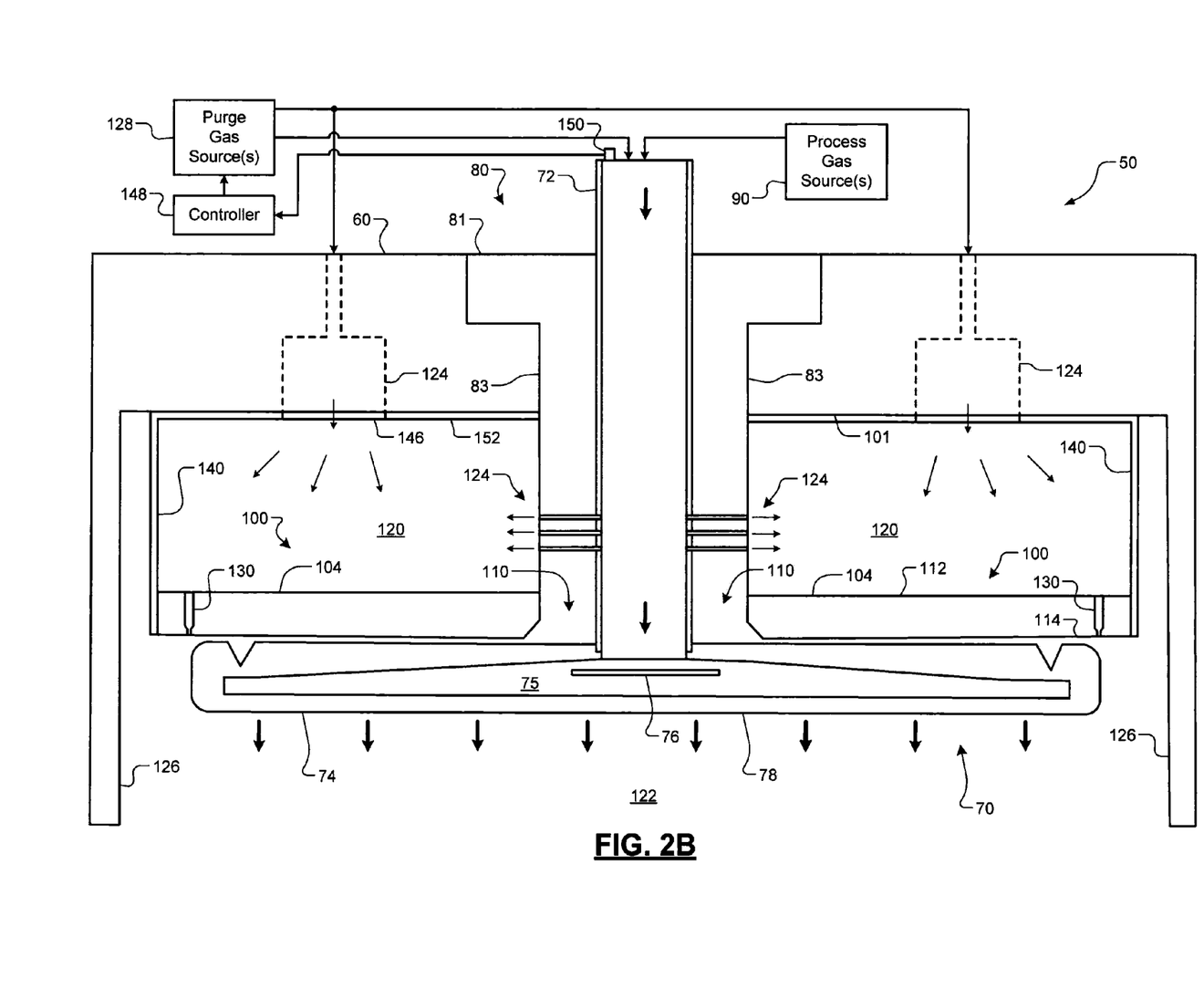
FIG. 2B is a cross-sectional view of a processing chamber with a showerhead and a second example suppressor assembly including an enclosure according to the principles of the present disclosure.
Figure 2C:
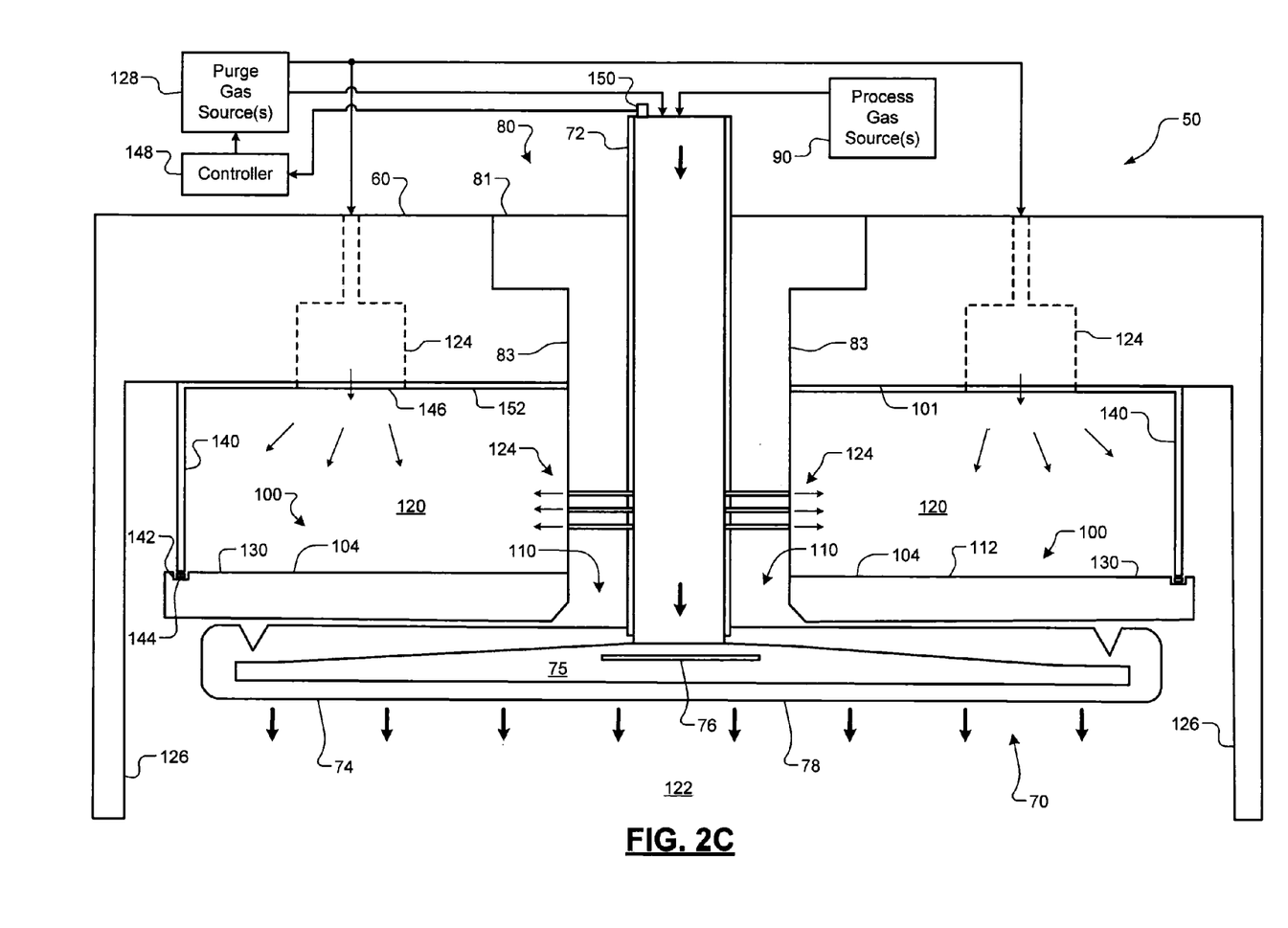
FIG. 2C is a cross-sectional view of a processing chamber with a showerhead and a third example suppressor assembly including an enclosure according to the principles of the present disclosure.
Figure 2D:
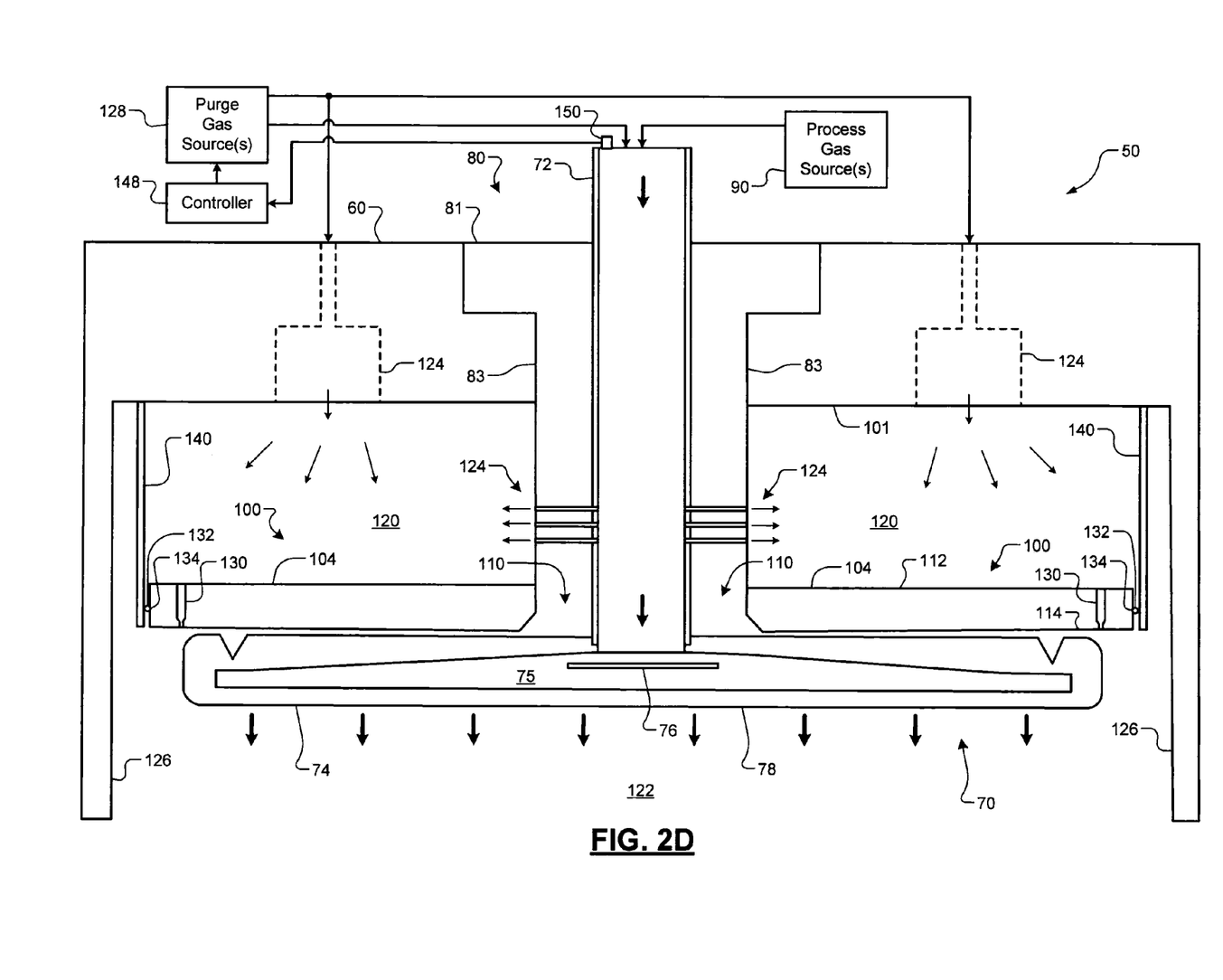
FIG. 2D is a cross-sectional view of a processing chamber with a showerhead and a fourth example suppressor assembly including an enclosure according to the principles of the present disclosure.

As shown in the examples in FIGS. 2A, 2B, and 2C, the enclosure 240 may include an upper plate 152 having the openings 146. Although as shown the upper plate 152 is directly adjacent to and in contact with the top surface 101, in other examples the upper plate 152 may be spaced apart from the top surface 101 with a gap therebetween. In another example as shown in FIG. 2D, the enclosure 140 may not include the upper plate 152. Accordingly, in some examples, the suppressor 104, the enclosure 140, and the upper plate 152 define the partitioned volume 120, while in other examples the suppressor 104, the enclosure 140, and the top surface 101 of the processing chamber 60 define the partitioned volume 120.

The suppressor 104 may be tuned to achieve a desired pressure within the partitioned volume 120 according to various parameters including, but not limited to, the pressure within the reaction volume 122 (which may be measured, predetermined based on the process being performed, modeled, etc.), the purge and process gases used, respective volumes of the partitioned volume 120 and the reaction volume 122, variations in the process being performed, variations in characteristics of the processing chamber 60, desired flow rates, etc. For example, if the openings 130 correspond to vias as shown in FIG. 3A, the openings 130 may be configured to be closed off, plugged, etc. according to a desired number of the openings 130. In one example, inner surfaces of the openings 130 are threaded and selected ones of the openings 130 may be closed off by inserting respective removable plugs (e.g., threaded plugs).

Figure 5:
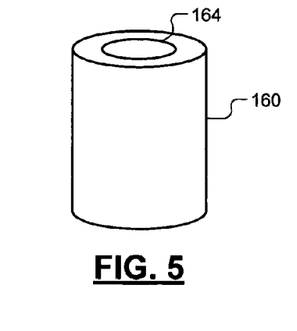
FIG. 5 is an example plug for an opening in a suppressor according to the principles of the present disclosure.

In some examples, the plugs may have respective vias having a smaller diameter than the openings 130. Accordingly, the plug may reduce the size of the opening 130 without completely closing off the opening 130. FIG. 5 shows an example plug 160 configured to be received within one of the openings 130. A via 164 formed through the plug 160 has a diameter that is less than a diameter of the opening 130. In this manner, the plug 160 modifies the flow of the purge gases from the partitioned volume 120 to the reaction volume 122, and therefore modifies the pressure within the partitioned volume 120.

Accordingly, the suppressor 104 (e.g., the selector 104 having a particular configuration of the openings 130) may be selected according to parameters such as the gases being used (e.g., both the purge gases and the process gases), and/or the further turning may be performed by modifying the selected suppressor 104. For example, the suppressor 104 having a predetermined quantity and/or configuration of the openings 130 may be selected for a particular purge gas to be used in a process and/or in a particular step in the process. In some examples, the suppressor 104 may be replaced with a suppressor having a different configuration of the openings 130 between processes. In other examples, the suppressor 104 may not be replaced, but one or more of the openings 130 may be closed off as described above between processes. For example only, the controller 148 may store and communicate data (e.g., a lookup table) indexing each purge gas to a parameters including, but not limited to, a particular suppressor 104 that should be installed, a configuration of the openings 130 (size, type, quantity, position, flow direction, whether any of the openings should be closed off, etc.) for the installed suppressor 104, flow rates of the purge gas, etc.

In some implementations, a flow direction of the openings 130 may be different according to a particular suppressor 104 that is installed. For example, while the openings 130 as shown have a vertical flow direction (i.e., perpendicular with respect to the suppressor 104), the openings 104 may be angled to direct the flow of purge gases outward (e.g., toward the side walls 126), inward (e.g., toward the showerhead 70), etc. In other implementations, positions of the openings 130 (e.g., relative to the showerhead 70) may be different according to the particular suppressor 104 that is installed. For example, if the openings 130 correspond to an annular slot or a plurality of vias arranged in a ring, a radius of the openings 130 relative to the stem portion 72 may be adjusted. In other words, if the radius is increased, the openings 130 are positioned further from the stem portion 72. Conversely, if the radius is decreased, the openings 130 are positioned closer to the stem portion 72.

In this manner, the position of the openings 130 can be selected based on a desired amount of interaction between the purge gases and the head portion 74 of the showerhead 70 in the reaction volume 122. For example, the openings 130 may be positioned further away from (e.g., positioned at a greater radius with respect to) an outer edge of the head portion 74 to decrease interaction between the purge gases and the head portion 74. Conversely, the openings 130 may be positioned closer to (e.g., positioned at a smaller radius with respect to) an outer edge of the head portion 74 to increase interaction between the purge gases and the head portion 74. Accordingly, the suppressor 104 may be selected further based on a size (e.g., width or diameter) of the head portion 74 of the showerhead 70.

The suppressor assembly 100 may be made of dielectric materials having different compositions to control various functions. The material may have a reduced metal composition such as oxides of metals. Using this type of material reduces possible metal contamination of a substrate such as a semiconductor wafer. Certain metal oxides may interact with precursors used for deposition, and their use may be reduced. The dielectric material may also be selected based on thermal conduction properties in order to either increase or decrease conduction of the suppressor assembly 100. In some examples, the suppressor assembly 100 is made of quartz, although other dielectric materials may be used. For example only, depending on the process chemistry, materials such as sapphire, alumina, or aluminum nitride may be used. Still other dielectric materials may be used.

While the suppressor assembly 100 according to the present disclosure is disclosed in conjunction with PECVD and PEALD processes, the suppressor assembly 100 may be used in other processes using the showerhead 70. For example only, the suppressor assembly 100 may be used in processes for creating conformal films.

Figure 6:
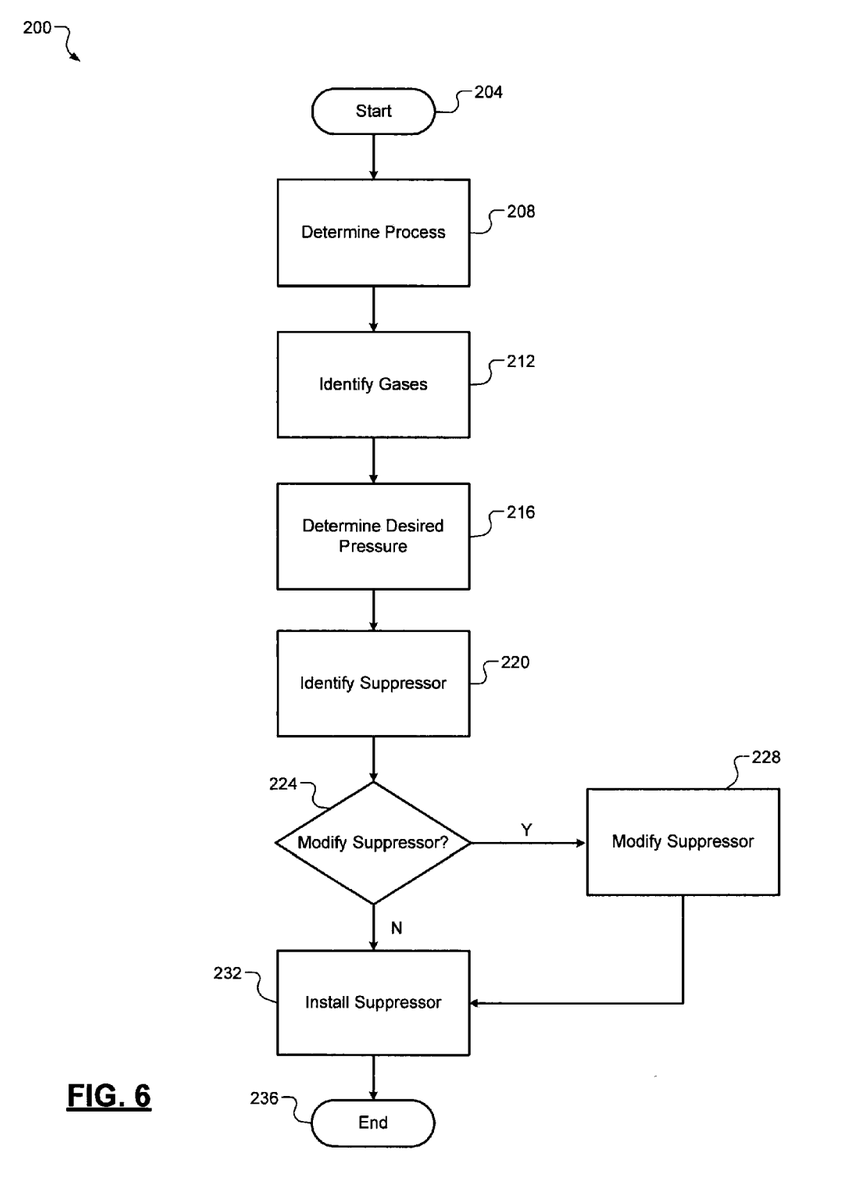
FIG. 6 illustrates steps of an example method for selecting and installing a suppressor behind a showerhead according to the principles of the present disclosure.

Referring now to FIG. 6, an example method 200 for selecting and installing a suppressor behind a showerhead begins at 204. At 208, the method 200 determines a process to be performed in a plasma processing chamber. For example, a user may input information (e.g., using an interface of the plasma processing chamber, such as an interface of the controller 148) indicating the process to be performed. At 212, the method 200 (e.g., the controller 148) identifies gases associated with the process. For example, the controller 148 may identify the gases (e.g., purge gases, process gases, etc.) using a lookup table or other stored data. Alternatively, the user may input information identifying the gases using an interface of the controller 148.

At 216, the method 200 (e.g., the controller 148) determines a desired pressure in a partitioned volume behind the showerhead based on the identified gases associated with the process. For example, the controller 148 may retrieve stored data indexing the identified gases to a desired pressure, the user may input information indicating the desired pressure, etc. The desired pressure may correspond to an absolute pressure or, in some examples, the desired pressure may correspond to an amount relative to (e.g., greater than) a pressure in a reaction volume in front of the showerhead. At 220, the method 200 identifies a suppressor based on the identified gases, the desired pressure, etc. For example, the controller 148 selects a suppressor from the stored data, a lookup table, etc. and provides an indicator of the selected suppressor to the user.

At 224, the method 200 determines whether modification of the suppressor is required to achieve the desired pressure. For example, the controller 148 determines whether any of the openings in the suppressor should be closed off to achieve the desired pressure. If true, the method 200 continues to 228. If false, the method 200 continues to 232. At 228, the selected suppressor is modified. For example, the controller 148 provides information indicating a quantity of the openings to modify and/or which type of plug to use to modify the suppressor (e.g., a plug to completely close off the openings, to reduce the diameter of the openings, etc.) and the user modifies the suppressor accordingly. At 232, the suppressor is installed within the processing chamber. The method 200 ends at 236.

Figure 7:
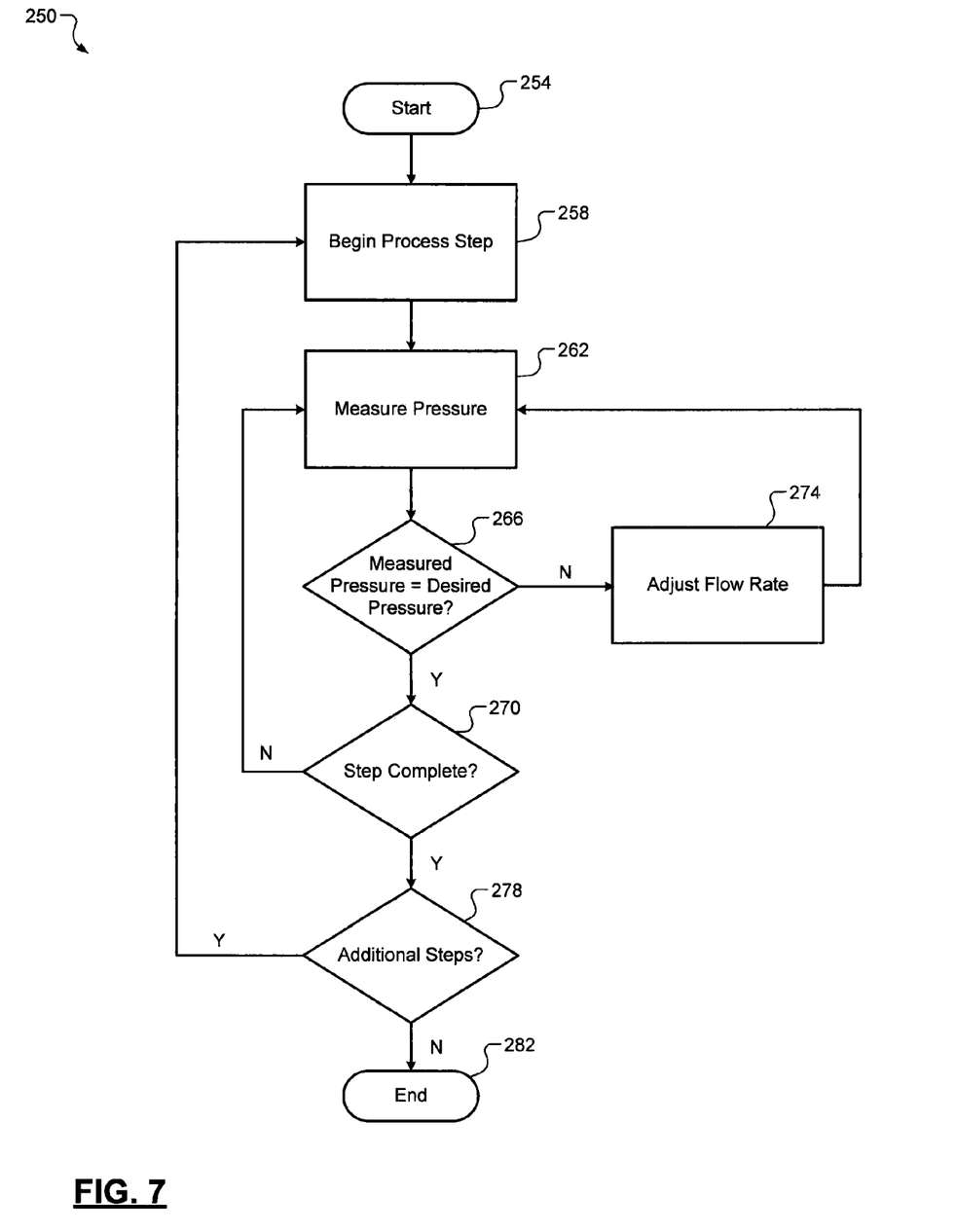
FIG. 7 illustrates steps of an example method for suppressing plasma behind a showerhead according to the principles of the present disclosure.

Referring now to FIG. 7, an example method 250 for suppressing plasma behind a showerhead during substrate processing begins at 254. At 258, the method 250 begins a process step. For example, inter alia, the controller 148 controls the flow of process gases and purge gases into a processing chamber. At 262, the method 250 measures a pressure within the partitioned volume 120. For example, the controller 148 communicates with the pressure sensor 150 to determine the pressure. At 266, the method 250 determines whether the measured pressure is approximately equal to a desired pressure within the partitioned volume 120. For example, the controller 148 compares the measured pressure to a desired pressure that is based on parameters including, but not limited to, the pressure within the reaction volume 122, the particular process step being performed, gas species (e.g., both purge and process gases) being used in the process step, characteristics of the processing chamber, etc. If true, the method 250 continues to 270. If false, the method 250 continues to 274. At 274, the method 250 (e.g., the controller 148) adjusts the flow rate of the purge gases to adjust the pressure.

At 270, the method 250 (e.g., the controller 148) determines whether the process step is complete. If true, the method 250 continues to 278. If false, the method 250 continues to 262. At 278, the method 250 (e.g., the controller 148) determines whether to perform an additional process step. If true, the method 250 continues to 258. If false, the method 250 ends at 282.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A substrate processing system comprising:
   a showerhead including a stem portion and a head portion, wherein the stem portion is in fluid communication with a process gas source, and wherein the head portion is arranged to provide process gases from the process gas source to a reaction volume of a processing chamber below the showerhead; and
   a suppressor arranged above the head portion of the showerhead,
      wherein the suppressor extends from the stem portion toward sidewalls of the processing chamber,
      wherein the suppressor is one of (i) sealed against the sidewalls of the processing chamber and (ii) sealed against an enclosure surrounding the suppressor within the sidewalls of the processing chamber,
      wherein a partitioned volume of the processing chamber is defined above the suppressor and below a top surface of the processing chamber and is further defined by one of (i) the suppressor, the sidewalls of the processing chamber, and the top surface of the processing chamber, (ii) the suppressor and the enclosure surrounding the suppressor, and (iii) the suppressor, the enclosure surrounding the suppressor, and the top surface of the processing chamber, and
      wherein the partitioned volume is in fluid communication with a purge gas source.

2. The substrate processing system of claim 1, wherein the suppressor includes at least one opening providing fluid communication between the partitioned volume and the reaction volume, wherein the opening is arranged to allow a purge gas to flow from the partitioned volume to the reaction volume.

3. The substrate processing system of claim 2, wherein the at least one opening comprises at least one of (i) a slot and (ii) a via.

4. The substrate processing system of claim 2, wherein at least one of a size, type, shape, position, flow direction, and quantity of the at least one opening is selected based on at least one of a gas species of the purge gas and a desired pressure in the partitioned volume.

5. The substrate processing system of claim 4, further comprising a controller configured to control a flow rate of the purge gas into the partitioned volume according to the desired pressure while plasma is being generated in the reaction volume.

6. The substrate processing system of claim 5, wherein the controller is configured to calculate the desired pressure based on a pressure within the reaction volume.

7. The substrate processing system of claim 5, wherein the controller is configured to control the flow rate such that the desired pressure is greater than a pressure within the reaction volume.

8. The substrate processing system of claim 5, wherein the controller is configured to control the flow rate based on a measured pressure within the partitioned volume.

9. The substrate processing system of claim 1, wherein the enclosure is cylindrical and the suppressor is a disc.

10. The substrate processing system of claim 1, further comprising a sealing member arranged between an end of the suppressor and (i) the sidewalls or (ii) the enclosure.

11. A substrate processing system, comprising:
    a showerhead including a stem portion and a head portion, wherein the stem portion is in fluid communication with a process gas source, and wherein the head portion is arranged to provide process gases from the process gas source to a reaction volume of a processing chamber below the showerhead; and
    a suppressor arranged above the head portion of the showerhead,
       wherein the suppressor extends from the stem portion toward sidewalls of the processing chamber,
       wherein the suppressor is one of (i) sealed against the sidewalls of the processing chamber and (ii) sealed against an enclosure surrounding the suppressor within the sidewalls of the processing chamber,
       wherein one of (i) the suppressor, the sidewalls, and a top surface of the processing chamber, (ii) the suppressor and the enclosure, and (iii) the suppressor, the enclosure, and the top surface define a partitioned volume of the processing chamber above the showerhead,
       wherein the partitioned volume is in fluid communication with a purge gas source,
       wherein the suppressor includes at least one opening providing fluid communication between the partitioned volume and the reaction volume, wherein the opening is arranged to allow a purge gas to flow from the partitioned volume to the reaction volume, and
       wherein an inner surface of the at least one opening is threaded.

12. A substrate processing system, comprising:
    a showerhead including a stem portion and a head portion, wherein the stem portion is in fluid communication with a process gas source, and wherein the head portion is arranged to provide process gases from the process gas source to a reaction volume of a processing chamber below the showerhead; and
    a suppressor arranged above the head portion of the showerhead,
       wherein the suppressor extends from the stem portion toward sidewalls of the processing chamber,
       wherein the suppressor is one of (i) sealed against the sidewalls of the processing chamber and (ii) sealed against an enclosure surrounding the suppressor within the sidewalls of the processing chamber,
       wherein one of (i) the suppressor, the sidewalls, and a top surface of the processing chamber, (ii) the suppressor and the enclosure, and (iii) the suppressor, the enclosure, and the top surface define a partitioned volume of the processing chamber above the showerhead, wherein the partitioned volume is in fluid communication with a purge gas source, wherein the suppressor includes at least one opening providing fluid communication between the partitioned volume and the reaction volume, wherein the opening is arranged to allow a purge gas to flow from the partitioned volume to the reaction volume, and wherein the at least one opening includes a plurality of openings, and wherein a first opening of the plurality of openings includes a removable plug that at least partially closes off the first opening to prevent the purge gas from flowing from the partitioned volume to the reaction volume.

13. The substrate processing system of claim 12, wherein the removable plug includes a via having a smaller diameter than the first opening.

* * * * *

UNITED STATES PATENT AND TRADEMARK OFFICE
CERTIFICATE OF CORRECTION

PATENT NO.      : 9,758,868 B1                              Page 1 of 1
APPLICATION NO. : 15/066550
DATED           : September 12, 2017
INVENTOR(S)     : Patrick Girard Breiling et al.

It is certified that error appears in the above-identified patent and that said Letters Patent is hereby corrected as shown below:

On the Title Page
Item (65), Publication No.:
Insert --US 2017-0260627 A1 Sept. 14, 2017--

Signed and Sealed this
Fourteenth Day of November, 2017

Joseph Matal
*Performing the Functions and Duties of the
Under Secretary of Commerce for Intellectual Property and
Director of the United States Patent and Trademark Office*